United States Patent [19]

Inskeep

[11] Patent Number: 5,007,020

[45] Date of Patent: Apr. 9, 1991

[54] METHOD FOR MEMORY ADDRESSING AND CONTROL WITH REVERSAL OF HIGHER AND LOWER ADDRESS

[75] Inventor: Jeffrey Inskeep, Marietta, Ga.

[73] Assignee: Hayes Microcomputer Products, Inc., Norcross, Ga.

[21] Appl. No.: 519,839

[22] Filed: May 7, 1990

Related U.S. Application Data

[62] Division of Ser. No. 27,635, Mar. 18, 1987, Pat. No. 4,924,441.

[51] Int. Cl.$^5$ .................. G06F 12/02; G06F 13/16
[52] U.S. Cl. .................... 364/900; 364/960.6; 364/933.2
[58] Field of Search ... 364/200 MS File, 900 MS File

[56] References Cited

U.S. PATENT DOCUMENTS 4,282,584 8/1981 Brown et al. ............... 364/900
4,794,517 12/1988 Jones et al. ............... 364/200

Primary Examiner—Lawrence E. Anderson
Attorney, Agent, or Firm—Jones, Askew & Lunsford

[57] ABSTRACT

An improved memory control and refresh apparatus as shown. For memory read operations, the read only memory and the random access memory are controlled by the NCSROM conductor (41) and the NCSRAM conductor (40), respectively, so that the read only memory and the random access memory do not compete for control of the data bus (20). However, the NCSRAM conductor (40) is not used to control the random access memory during write operations. Therefore, when transferring blocks of data from the read only memory (60) to the random access memory (61,62) the NCSROM conductor (41) is active during both reading of data from the read only memory (60) and writing of the data to the random access memory (61). Since the NCSROM conductor (41) is active during both read and write operations, and since data can be written into the random access memory (61) by activating the NWR conductor (24), it can be said that the data transfer occurs, figuratively, by reading from the read only memory and then "writing" to the read only memory. A pair of flip-flops (76,77) are used in conjunction with the NMREQ signal (26) to activate the hidden refresh feature of the selected random access memory (61, 62). This allows for refreshing of a larger random access memory than is otherwise supported by the refresh feature provided by the processor (10). The high and low order bytes of the address bus (21) are reversed to the electrically erasable and programmable memory (63) so that fewer instructions are required to transfer quantities of data to the memory (63) using the page write feature of the memory (63). The result is a memory control and refresh apparatus which uses fewer components and accomplishes transfers of data using fewer instructions.

8 Claims, 4 Drawing Sheets

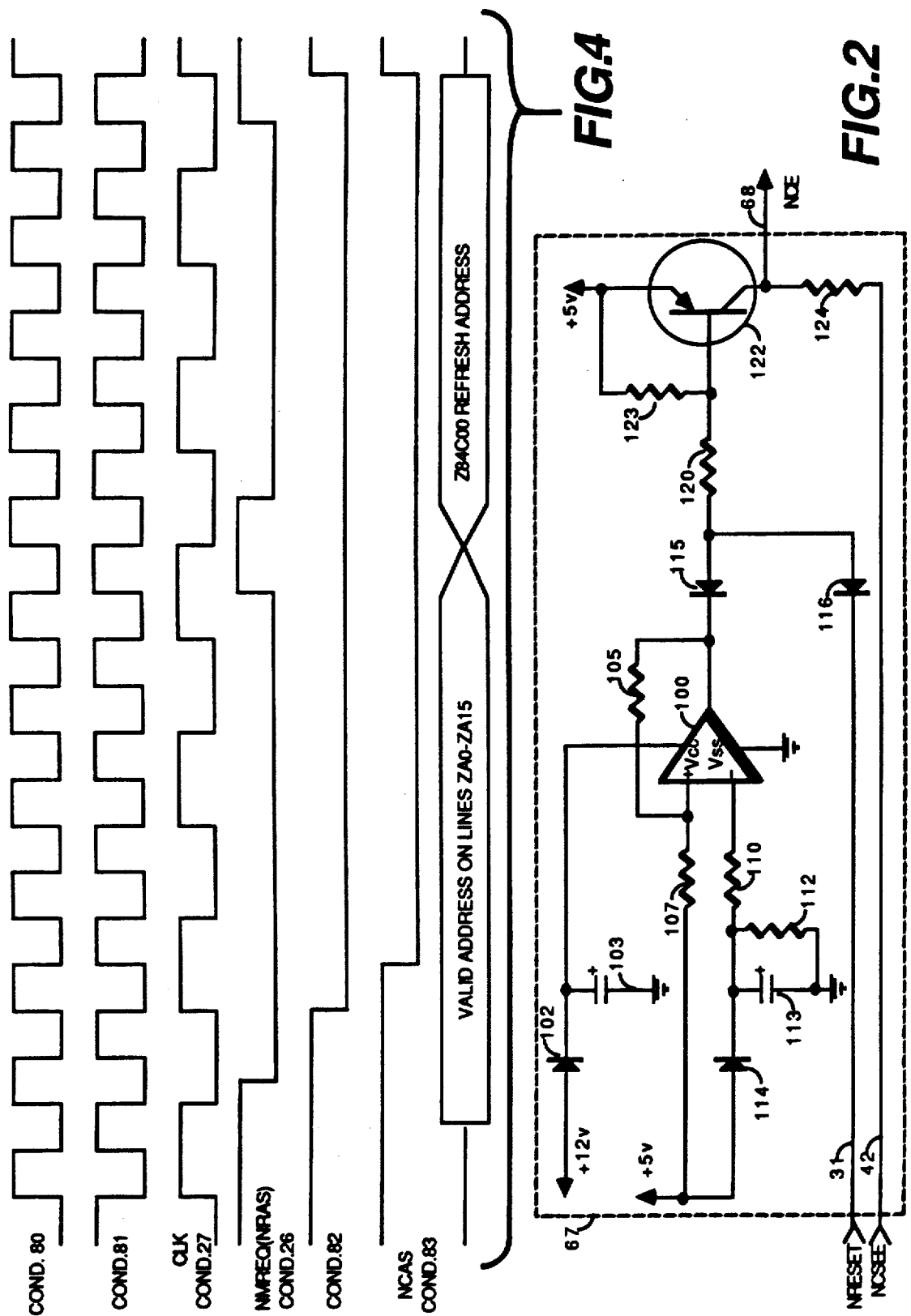

METHOD FOR MEMORY ADDRESSING AND CONTROL WITH REVERSAL OF HIGHER AND LOWER ADDRESS

This is a divisional application of U.S. Pat. application Ser. No. 027,635 filed Mar. 18, 1987, now U.S. Pat. No. 4,924,441, issued May 8, 1990, by Jeffrey Inskeep, entitled "Improved Method and Apparatus for Memory Addressing and Control."

TECHNICAL FIELD

The present invention relates to the operation of a memory and particularly discloses an improved apparatus for implementing memory transfers, addressing, and refreshing of random access memories.

BACKGROUND OF THE INVENTION

Since widespread use of integrated circuits began in the 1960's, the demand for data communications equipment has increased rapidly throughout the world. As more and more businesses, and even homes, came to rely on low cost computers, there arose a growing need for data communication devices, commonly known as modems, which could be used over dial up voice grade telephone lines.

It is known to those skilled in the art that it is highly desirable to use microprocessors in implementing modems. Microprocessors are now commonly used to implement a number of different functions within a modem. It is also known to those skilled in the art that microprocessors require memories for the storage and retrieval of operating instructions and data. Several different types of memories are currently used with microprocessors: read only memories (ROM), ultraviolet light erasable and electrically programmable read only memories (UVPROM), electrically erasable and programmable read only memories (EEPROM), also sometimes referred to as nonvolatile random access memories (NVRAM, NOVRAM), static random access memories (SRAM), and dynamic random access memories (DRAM).

In modems, the memory components typically comprise a UVPROM for the storage and retrieval of operating instructions, and EEPROM for the storage and retrieval of modem operating parameters and other data such as telephone numbers, and either a SRAM or a DRAM for the temporary storage and retrieval of data. SRAMs do not require refreshing of the memory, however, SRAMs are typically priced higher than DRAMs of the same memory capacity. DRAMs tend to be physically smaller and have a lower package pin count than SRAMs due to the multiplexing of the address lines. However, DRAMs require that the memory be periodically refreshed or the data will be lost.

Some microprocessors do not directly support the refresh operation and therefore a separate circuit is required to accomplish refreshing of the DRAMs. Other microprocessors directly support the refresh operation but can directly refresh only a portion of the memory which is available to the microprocessor. An example of such a microprocessor is the Z84C00 microprocessor, manufactured by Zilog, Campbell, Calif. Details of operation of the Z84C00 microprocessor have been published by the manufacturer and are available from the manufacturer upon request.

Therefore, there is a need for a simple circuit, which can be used with a microprocessor having a limited refresh capability, which will provide for refreshing of the entire memory available to the microprocessor.

Many circuits involving microprocessors use both a UVPROM and a random access memory (RAM), the RAM being either a DRAM or a SRAM. In many operations it is desirable to read the contents of the read only memory (ROM), write the contents into the RAM, and thereafter use only the RAM so that the ROM can be placed in a standby mode where it consumes less power. Typically, in order to accomplish the transfer of the contents from the ROM to the RAM the microprocessor places a first address on the address lines, reads the contents of that address from the ROM, places a second address on the address lines, writes the contents into the RAM, and so on until the contents of the ROM have been transferred to the RAM. The process of changing the address from the address required for the ROM to the address required for the RAM and vice versa, requires additional time and therefore slows the operation of the microprocessor.

Therefore, there is a need for a circuit which allows the ROM and RAM to exist, without conflict, at the same address so that the address does not have to be changed when switching from the ROM to the RAM.

In microprocessor circuits which also use an EEPROM, and in which the microprocessor memory space is completely allocated to ROM and RAM memory, the EEPROM is frequently mapped into the input/output (I/O) space. Other devices are also mapped into the I/O space and therefore some of the address lines are used to designate the EEPROM or another device, and some or all of the remaining lines are used to select the location of the desired data. At least one EEPROM device allows the transfer of a string of data, often referred to as a page of data, by simply incrementing the location of the desired data. However, care must be taken, and extra program steps are usually required, in order to prevent the incrementing process from affecting the address lines used to designate the particular device. The data transfer would be speeded up in the extra program steps could be removed so that the miroporcessor could operate more efficiently. Therefore, there is a need for a circuit which allows connecting EEPROM's and other I/O devices to the microprocessor in such a manner that the extra program steps can be removed.

SUMMARY OF THE PRESENT INVENTION

The present invention provides an improved method and apparatus for the refreshing of a dynamic random access memory (DRAM).

The present invention also provides an improved method and apparatus for allowing a read only memory (ROM) and a random access memory (RAM) to exist at the same address without conflict.

The present invention also provides an improved method and apparatus for addressing an electrically erasable and programmable read only memory (EEPROM) in the input/output (I/O) space of a microprocessor.

Broadly stated, the present invention provides an improved method and apparatus for the control, addressing, and refreshing of memory associated with a microprocessor.

Frequently, in order to conserve or limit the number of pins required on a RAM package, the address will be multiplexed into the RAM. Typically, the first 8 bits of the address are multiplexed into the RAM address inputs as the row address. This is followed by multiplexing the second 8 bits of the address into the RAM address inputs as the column address. Most dynamic random access memories (DRAM) do not require that each address in the DRAM be individually refreshed but require only that each individual row be addressed for refreshing. Refreshing a row therefore automatically refreshes all of the column addresses associated with that row. Some microprocessors directly provide for refreshing by addressing the rows but the refresh row address that they provide is only seven bits and not 8 bits. If the microprocessor address line has 16 bits the microprocessor can address 65,536 (64k) words. However, since the refresh address output is only seven bits, then only 32,768 (32k) words can be refreshed. Therefore, using the refresh method directly supported by the microprocessor, only one half of the available memory can be DRAM.

Some DRAMs have a "hidden" refresh feature whereby the entire DRAM can be refreshed, a row at a time, using an internal counter in the DRAM, by pulsing the row address strobe when the column address strobe is in a predetermined state. Since the refresh is no longer dependent upon the number of refresh address bits available from the microprocessor, the DRAM can occupy substantially more of the available microprocessor memory space. The present invention provides for the generation of the row address strobe and the column address strobe such that the row address strobe is automatically pulsed during the time that the column address strobe is in the required predetermined state. Therefore, the entire DRAM can be refreshed regardless of the refresh limitations of the microprocessor.

Also broadly stated, the present invention provides for the rapid transfer of data from the ROM into the RAM by allowing the ROM and RAM to exist at the same addresses without conflict. Since the ROM and the RAM exist at the same addresses, data can be transferred from the ROM to the RAM by reading the data from the ROM and then "writing the data to the ROM". One cannot literally write to a ROM, however, since the ROM and the RAM exist at the same address space, commanding the microprocessor to write to the ROM effectively causes the data to be written into the RAM. Conflict between the ROM and the RAM is avoided by enabling the output of the ROM and disabling the output of the RAM. Thereafter, when data is to be read from the RAM, the output of the ROM is disabled and the output of the RAM is enabled. Since the ROM and RAM exist in the same address space, it is not necessary for the microprocessor to change the address when transferring data from the ROM to the RAM and, therefore, the speed of the data transfer is improved.

Also broadly stated, the present invention provides for addressing an EEPROM in such a manner that the speed and efficiency of the controlling microprocessor are improved during transfers of one or more pages of data.

The 16-bit address line is considered as having a low order byte and a high order byte, each byte having 8 bits. Also, part of the low order byte is used to address (enable) the EEPROM or another selected device. Instead of incrementing the low order byte, and checking to ascertain that the incrementing has not affected the part used to address the EEPROM, the high and low order bytes to the EEPROM are switched, and the high order byte is incremented.

This eliminates the need to check the low order byte after each increment, and therefore improves the speed and efficiency of the microprocessor.

Therefore, it is an object of the present invention to provide an improved memory control and refresh apparatus.

It is another object of the present invention to provide a method and an apparatus for efficiently transferring data from a ROM to RAM.

It is another object of the present invention to provide a method and an apparatus for refreshing a dynamic random access memory.

It is another object of the present invention to provide a method and an apparatus for efficiently transferring data to an EEPROM.

These and other object of the present invention will become apparent from the detailed description below.

BRIEF DESCRIPTION OF THE DRAWINGS

FIG. 2 is a schematic diagram of the EEPROM write protection circuit.

FIG. 4 is a timing diagram illustrating the generation of the signals required to activate the hidden refresh capability.

DETAILED DESCRIPTION

Figure 1A:
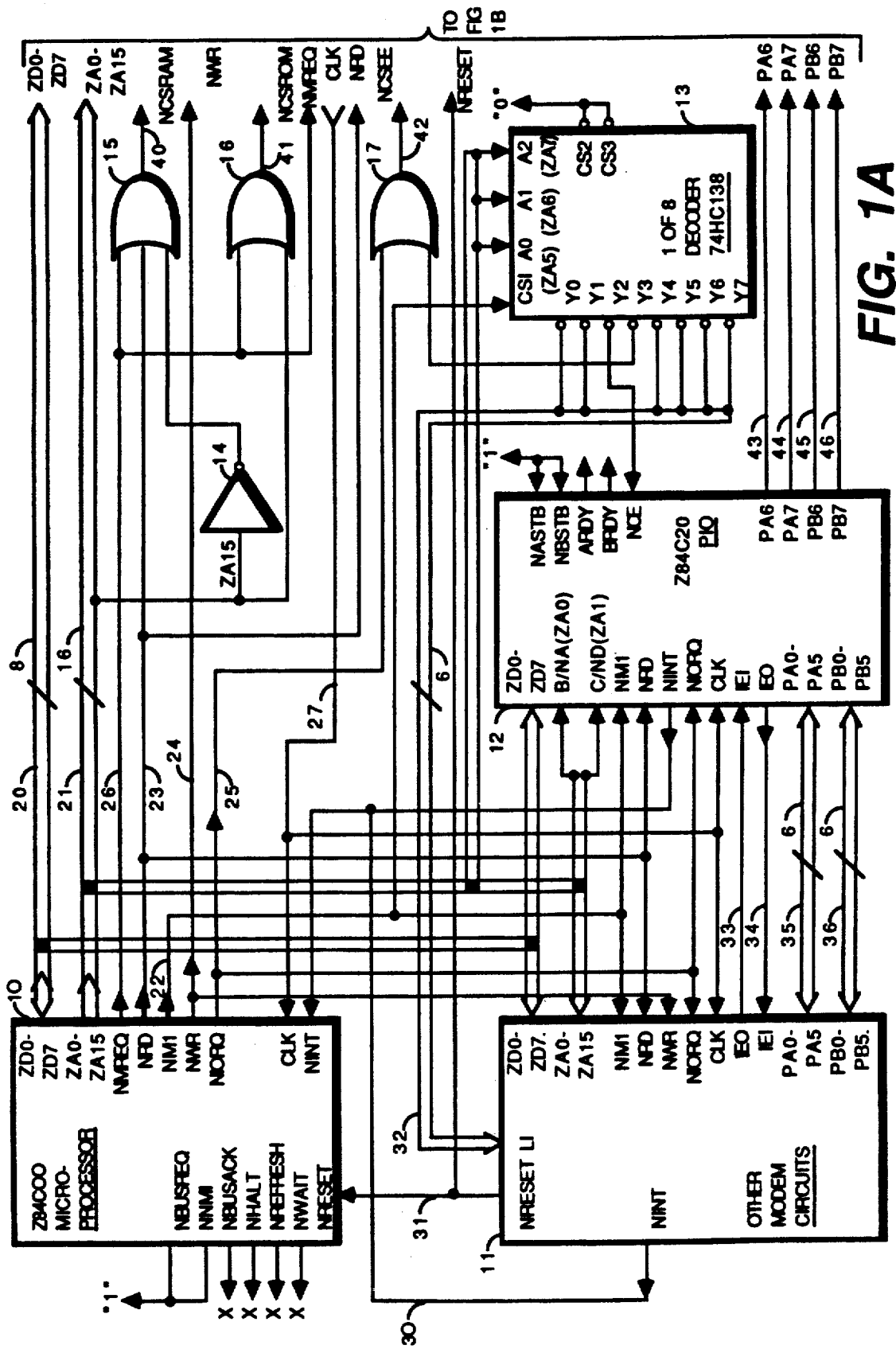
FIGS. 1A and 1B are a schematic diagram of the preferred embodiment of the present invention.
Figure 1B:
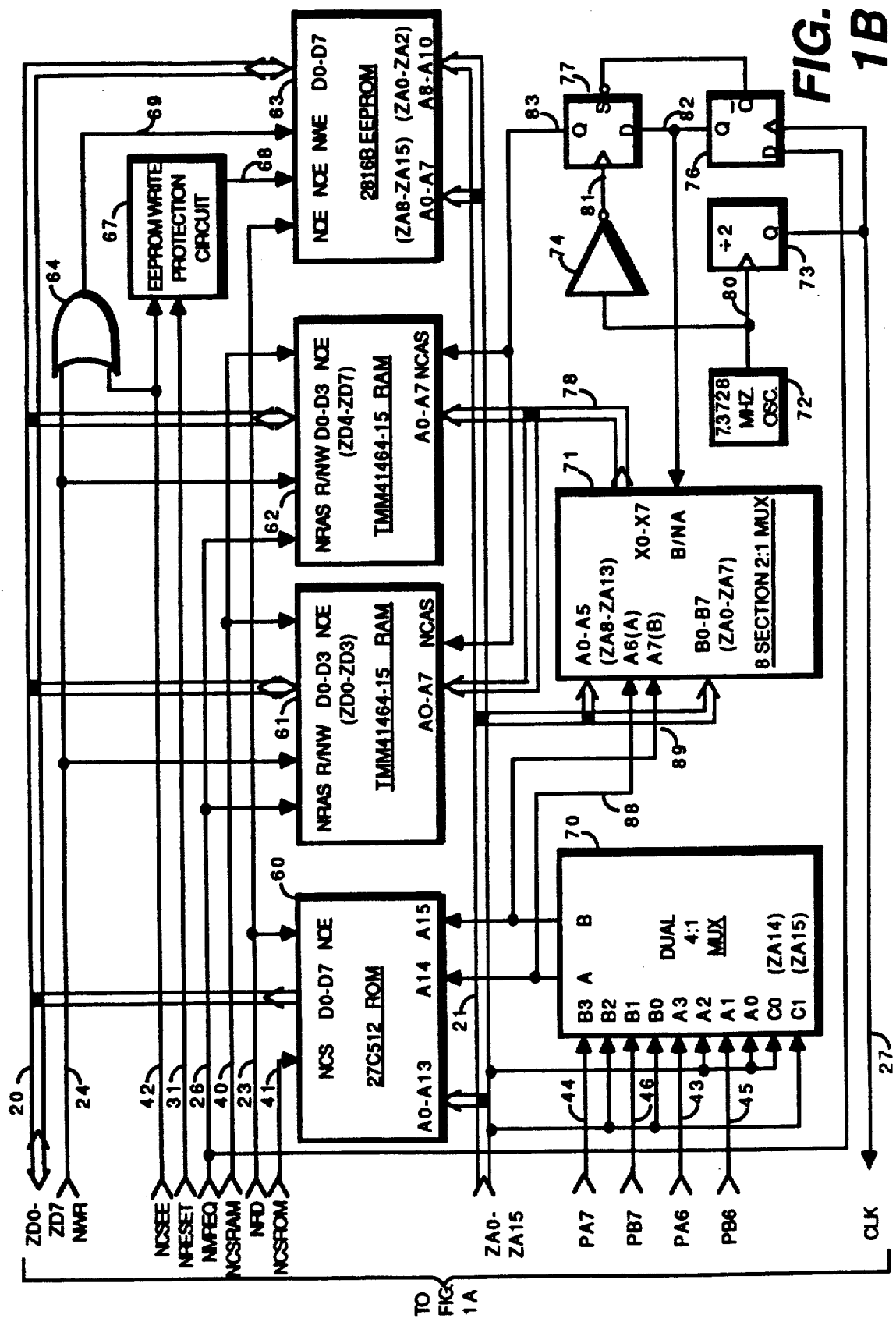

Turning now to the drawings, in which like numerals represent like components throughout the several figures, the preferred embodiment of the present invention will be described. FIGS. 1A and 1B are a schematic diagram of the preferred embodiment of the present invention in its preferred environment. The preferred environment of the present invention is in a modem but it will be appreciated that the present invention lends itself to other devices which use a microprocessor and memory. Microprocessor 10 is Z84C00 microprocessor manufactured by Zilog, Campbell, Calif. Details of operation of the Z84C00 have been published by and are available from the manufacturer upon request. Microprocessor 10 has an 8 bit data input/output port (ZD0–ZD7), and a 16 bit address port (ZA0–ZA15). Microprocessor 10 also provides the following outputs: negated machine cycle 1 (NM1), negated read (NRD), negated write (NWR), negated input/out request (NIORQ), negated memory request (NMREQ), negated bus acknowledge (NBUSACK), negated halt (NHALT), negated refresh (NREFRESH), and negated wait (NWAIT). In the preferred embodiment, the NBUSACK, NHALT, NREFRESH, and NWAIT outputs are not required. Microprocessor 10 also has the following inputs: clock (CLK), negated reset (NRESET), negated interrupt request (NINT), negated bus request (NBUSREQ), and negated nonmaskable interrupt (NNMI). In the preferred embodiment the NBUSREQ and NNMI inputs are not used and are connected to a logic 1.

The other modem circuits 11 represent other circuits used in a modem such as the modulator, demodulator, power up reset circuitry, and telephone line interface.

Parallel input/output (PIO) 12 is an Z84C20, manufactured by Zilog, Campbell, Calif. Details of operation of the Z84C20 have been published by and are available from the manufacturer upon request. PIO 12 has an 8 bit data port (ZD0–ZD7), two 8 bit parallel input/output ports (PA0-PA7, PB0-PB7). PIO 12 has the following inputs: port b negated port a select (B/NA), control/negated data select (C/ND), negated chip enable (NCE), interrupt enable in (IEI), negated port a strobe (NASTB), negated port b strobe (NBSTB), NM1, NRD, NIORQ, and CLK. The NASTB and NBSTB inputs are not required and are connected to a logic 1. The NM1, NRD, NIORQ, and CLK inputs correspond to like named outputs and inputs of microprocessor 10. PIO 12 has the following outputs: register A ready (ARDY), and register B ready (BRDY), negated interrupt (NINT), and interrupt enable out (IEO).

Decoder 13 is a standard 1-of-8 decoder such as the 74HC138. The enable 1 and enable 2 (EN1, EN2), inputs of decoder 13 are not required and are connected to a logic 0. Read only memory (ROM) 60 is a 27C512 65k by 8 bit UVPROM manufactured by Advanced Micro Devices, Inc., Sunnyvale, Calif. Details of operation of ROM 60 have been published by and are available from the manufacturer upon request. RAM 61 and 62 are 65k by 4 bit TMM41464-15 dynamic random access memories (DRAM) manufactured by Toshiba America, Inc., Tustin, Calif. Details of operation of RAMs 61 and 62 have been published by and are available from the manufacturer upon request. Electrically erasable and programmable read only memory (EEPROM) 63 is a 2k by 8 bit 2816B memory manufactured by Xicor, Inc., Milpitas, Calif. Details of operation of EEPROM 63 have been published by and are available from the manufacturer upon request.

The data port (ZD0-ZD7) of microprocessor 10 is connected by data bus 20 to the data ports of the other modem circuits 11, PIO 12, ROM 60, and EEPROM 63. In addition, also, the ZD0-ZD3 lines of data bus 20 are connected to the D0-D3 data port of RAM 61 and lines ZD4-ZD7 of data bus 20 are connected to the D0-D3 data port of RAM 62. It will be appreciated that RAMs 61 and 62 collectively form a 65k word by 8 bit RAM. The address port (ZA0-ZA15) of microprocessor 10 is connected by address bus 21 to the address port input of the other modem circuits 11 and, as described below, to PIO 12, decoder 13, ROM 60, RAMs 61 and 62, EEPROM 63 and multiplexers 70 and 71. The ZA5, ZA6, and ZA7 lines of address bus 21 are connected to the A0, A1, and A2 control inputs, respectively, of decoder 13. The NM1 output of microprocessor 10 is connected by conductor 22 to the CS1 control input of decoder 13. The CS2 and CS3 inputs of decoder 13 are not required in the preferred embodiment and are therefore connected to a logic 0. The Y0, Y1, Y4, Y5, Y6, and Y7 outputs of decoder 13 are connected by latch bus 32 to the latch input (LI) of the other modem circuits 11 and are used to control the other modem circuits. The Y2 output of decoder 13 is connected to the NCE input of PIO 12 and is used to allow microprocessor 10 to select PIO 12. The Y3 output of decoder 13 is connected to one input of a two input OR-gate 17. The NIORQ output of microprocessor 10 is connected by conductor 25 to the other input of OR-gate 17. The output of OR-gate 17 is the NCSEE signal on conductor 42. The NCSEE signal on conductor 42 is one of the signals used to control EEPROM 63.

The NM1, NRD, NWR, and NIORQ outputs of microprocessor 10 are connected by conductors 22, 23, 24, and 25 respectively, to the respective like named inputs on the other modem circuits 11 and PIO 12. The NINT output of the other modem circuits 11 and PIO 12 are connected by conductor 30 to the like named input of microprocessor 10. The IEO output of other modem circuits is connected by conductor 33 to the IEI input of PIO 12. Likewise, the IEO output of PIO 12 is connected by conductor 34 to the IEI input of the other modem circuits 11. The first 6 bits (PA0-PA5) of port A and the first 6 bits (PB0-PB5) of port B, of PIO 12, are connected by buses 35 and 36, respectively, to the like named ports on the other modem circuits 11. These 12 bits are used to exchange control and/or data information between microprocessor 10 and the other modem circuits 11 via PIO 12. Two lines of address bus 21 are also used to control PIO 12. The ZA0 and ZA1 lines of address bus 21 are connected to the B/NA and C/ND inputs, respectively, of PIO 12. The use of microprocessor 10 to control the operation of PIO 12, and the above mentioned connections, are straight forward and well known to those skilled in the art. The PA6, PA7, PB6, and PB7 outputs of PIO 12 are used for memory addressing in the preferred embodiment.

The ZA15 line of address bus 21 is connected to the input of inverter 14 and to one input of a 2-input OR-gate 16. The output of inverter 14 is connected one input of a 3-input OR-gate 15. The NMREQ output of microprocessor 10 is connected by conductor 26 to the other input of OR-gate 16 and to the second input of OR-gate 15. The NRD output of microprocessor 10 is connected by conductor 23 to the third input of OR-gate 15. The output of OR-gate 15 on conductor 40 is the negated RAM chip select signal (NCSRAM). The output of OR-gate 16 on conductor 41 is the negated ROM chip select signal (NCSROM).

The negated reset (NRESET) output of the other modem circuits 11 is connected by conductor 31 to the NRESET input of microprocessor 10. CLK conductor 27 is connected to the CLK inputs of microprocessor 10, PIO 12, and the other modem circuits 11.

NCSEE conductor 42 is connected to one input of a 2-input OR-gate 64 and to one input of EEPROM write protection circuit 67. NRESET conductor 31 is connected to the other input of EEPROM write protection circuit 67. The output of EEPROM write protection circuit 67 is connected by conductor 68 to the negated chip enable (NCE) input of EEPROM 63. NRD conductor 23 is connected to the negated output enable (NOE) of ROM 60 and EEPROM 63. NWR conductor 24 is connected to the read/negated write input (R/NW) of RAMs 61 and 62, and to the other input of 2-input OR-gate 64. The output of OR-gate 64 is connected by conductor 69 to the negated write enable (NWE) input of EEPROM 63.

The output of 7.3728 MHz oscillator 72 is connected by conductor 80 to the input of inverter 74 and to the clock input of a divide-by-two divider 73. The Q output of divider 73 is the CLK signal on conductor 27 which goes to the circuits in FIG. 1A and to the clock input of flip-flop 76. The frequency of the CLK signal on conductor 27 is therefore 3.6864 MHz. Lines ZA0-ZA2 of address bus 21 are connected to the A8-A10 address inputs of EEPROM 63. Lines ZA8-ZA15 of address bus 21 are connected to the A0-A7 address inputs of EEPROM 63.

It will be appreciated from an inspection of FIG. 1B and the above description that a logic 0 must be placed on NCSEE conductor 42 and NRD conductor 23 in order to read data from EEPROM 63, and a logic 0 must be placed on NCSEE conductor 42 and NWR conductor 24 in order to write data to EEPROM 63. Since the NCSEE signal on conductor 42 is controlled by the Y3 output of decoder 13 and the NIORQ signal on conductor 25 the EEPROM 63 lies in the I/O space of microprocessor 10. Note also that the high and low order bytes of address bus 21 are reversed and that they are connected to the low and high order bytes, respectively, of the address inputs of EEPROM 63.

Consider now the benefits of the above-described connection of decoder 13 and EEPROM 63. First, only a single instruction such as OUT(C), r is required to select a device (through decoder 13) and provide address or control information to the device (via address bus 21 lines ZA0-ZA4, and ZA8-ZA15). Second, only three address lines (ZA5-ZA7) are required to select up to eight devices so that the above remaining 13 lines of address bus 21 can be used to directly address up to 8192 bytes of I/O space. Third, when using the page write mode of EEPROM 63, addresses A0-A4 (ZA8-ZA12) of EEPROM 63 are incremented while address lines A5-A10 (ZA13-ZA15, ZA0-ZA2) remain the same. Note that when using the OUT(C), r instruction, microprocessor 10 places the contents of the C register onto address lines ZA0-ZA7 and the contents of register B on address lines ZA8-ZA15. Therefore, incrementing of the address to EEPROM 63 during the page write mode is easily accomplished by incrementing the contents of register B of microprocessor 10 rather than modulo-2 counting on the C register.

It will be appreciated that this technique is not limited to EEPROM's, nor is it limited to page write operations. This technique is also useful for transferring strings of data to/from other devices which have addressable storage space and which have an addressing constraint when used in the page mode.

More precisely, using the address lines in the conventional manner, the C register of microprocessor 10, which controls address lines ZA0-ZA7, can only be incremented eight times (incrementing address lines ZA0-ZA2) before it is necessary to reset lines ZA0-ZA2 and increment the B register, which controls lines ZA8-ZA15. However, by switching the high and low order bytes to EEPROM 63 allows the address (B register) to be incremented up to 255 times ($2^8-1$) before it is necessary to reset lines ZA8-ZA15 and increment the C register. Therefore, the data transfer can proceed at a faster rate since fewer steps are involved. Of course, the 2816B EEPROM 63 only allows 32 bytes of information to be written for each occurrence of the page write mode, so the B register is only incremented 21 times for each page write mode operation.

Turn now to FIG. 2 which is a schematic diagram of the EEPROM write protection circuit 67. The anode of diode 102 is connected to a plus 12 volt output of a power supply (not shown). The cathode of diode 102 is connected to one end of a 10 microfarad capacitor 103 and the VCC terminal of a comparator 100. The VSS terminal of comparator 100 is connected to the circuit ground. Diode 102 and capacitor 103 assure that comparator 100 remains at an operating state for a short period after the power supply has failed. The plus 5 volt output of the power supply is connected to one end of resistor 107. The other end of resistor 107 is connected to one end of feedback resistor 105 and to the non-inverting input (+) of comparator 100. The output of comparator 100 is connected to the other end of resistor 105. It will be appreciated by those skilled in the art that resistors 105 and 107 provide a degree of hysteresis to the operation of comparator 100. In the preferred embodiment, resistors 105 and 107 have values of 1 megohm and 10 kilohms, respectively.

The plus 5 volt output of the power supply is also connected to the anode of diode 114. The cathode of diode 114 is connected to one terminal of capacitor 113, one end of resistor 112, and one end of resistor 110. The other end of capacitor 113 and resistor 112 are connected to circuit ground. The other end of resistor 110 is connected to the inverting input (−) of comparator 100. Note that resistor 107 allows the non-inverting input of comparator 100 to follow variations in the plus 5 volt power supply. Diode 114 allows the inverting input of comparator 100 to follow positive-going variations in the plus 5 volt power supply. However, the time constant of capacitor 113, and resistor 112 provides a time delay on negative-going variations. Diode 114 also provides a slight voltage drop so that, when the plus 5 volt power supply is stable or increasing, the non-inverting input of comparator 100 is positive with respect to the inverting input of comparator 100 and, therefore, the output of comparator 100 will be plus 12 volts. However, should the plus 5 volt supply begin to fail, experience excessive negative-going transients, or begin following after a positive-going transient, the non-inverting input of comparator 100 will become negative with respect to the inverting input of comparator 100 and, therefore, the output of comparator 100 will be 0 volts.

The output of comparator 100 is connected to the cathode of diode 115. The NRESET signal on conductor 31 is connected to the cathode of diode 116. The anodes of diodes 115 and 116 are connected to one end of resistor 120. The other end of resistor 120 is connected to one end of resistor 123 and to the base of PNP transistor 122. The other end of resistor 123 and the emitter of transistor 122 are connected to the plus 5 volt power supply. The NCSEE signal on conductor 42 is connected to one end of resistor 124. The other end of resistor 124 and the collector of transistor 22 are connected to conductor 68 which provides the NCE signal to EEPROM 63 (FIG. 1B). When the output of comparator 100 is 0 volts, which indicates that the plus 5 volt power supply has failed or is experiencing excessive transients, or if the NRESET signal on conductor 31 is a logic 0, thus indicating that a reset is in process, transistor 122 will be turned on and provide a logic 1 to the NCE input of EEPROM 63, thereby preventing data from being written into EEPROM 63. This prevents data from being written into EEPROM 63 during periods when the data may be incorrect, such as during reset, power failure, or excessive transients on the plus 5 volt power supply.

When the output of comparator 100 and NRESET signal on conductor 31 are both high, transistor 122 will be turned off. At this point, the NCSEE signal on conductor 42 controls the NCE input of EEPROM 63 through resistor 124. Resistor 124 provides that transistor 122 control the NCE signal on conductor 68 when transistor 122 is turned on and allows the NCSEE signal on conductor 42 to control NCE conductor 68 only when transistor 122 is turned off. This prevents the NCSEE signal on conductor 42, which may be incorrect during power failure, reset, or excessive transients, from allowing data to be written into EEPROM 63 during these time periods when the data may be incorrect. Therefore, EEPROM write protection circuit 67 prevents data from being written into EEPROM 63 during times when the data is subject to errors.

Although the above has been described with respect to the operation of an EEPROM, it will be appreciated that the write protection circuit can also be used to prevent improper writing of data to other devices, such as RAM's, disk drives, etc.

Turn back now to FIG. 1B. NCSRAM conductor 40 is connected to the negated output enable (NOE) inputs of RAMs 61 and 62. NCSROM conductor 41 is connected to the negative chip select (NCS) input of ROM 60. The ZA0–ZA13 lines of address bus 21 are connected to the A0–A13 inputs, respectively, of ROM 60. The ZA0–ZA7 lines of address bus 21 are connected to the B0–B7 inputs, respectively, of an 8 section 2:1 multiplexer (MUX) 71. Address lines ZA8–ZA13 of address bus 21 are connected to A0–A5 inputs, respectively, of MUX 71. The ZA14 lines of address bus 21 is connected to the A0, A2, and C0 inputs of a dual 4:1 multiplexer (MUX) 70. The ZA15 line of address bus 21 is connected to the B2, B0, and C1 inputs of MUX 70. PA7 conductor 44, PB7 conductor 46, PA6 conductor 43, and PB6 conductor 45 are connected to the B3, B1, A3, and A1 inputs, respectively, of MUX 70. The A output of MUX 70 is connected by conductor 88 to the A6 input of MUX 71 and the A14 input of ROM 60. The B output of MUX 70 is connected by conductor 89 to the A7 input of MUX 71 and the A15 input of ROM 60. The X0–X7 outputs of MUX 71 are connected by bus 78 to the A0–A7 inputs, respectively, of RAMs 61 and 62. In the preferred embodiment, MUX 70 is a type 74 HC 153 and MUX 71 comprises two type 74 HC 158.

Table 1 shows the A and B outputs of MUX 70 as a function of address lines ZA14 and ZA15. Note that when ZA14 is a logic 0, the A and B outputs are identical to the ZA14 and ZA15 address lines, respectively. However, when address line ZA14 is a logic 1, then address line ZA15 is used to select lines PB6 and PB7 (ZA15=0) or lines PA6 and PA7 (ZA15=1) for the A and B outputs, respectively. The PB6 and PB7 lines are primarily used to select different blocks of ROM 60 and lines PA6 and PA7 are primarily used to select different blocks of RAMs 61 and 62.

TABLE 1

| C1 (ZA15) | C0 (ZA14) | MUX 70 OUTPUTS A | B |
|---|---|---|---|
| 0 | 0 | 0(ZA14) | 0(ZA15) |
| 0 | 1 | PB6 | PB7 |
| 1 | 0 | 0(ZA14) | 1(ZA15) |
| 1 | 1 | PA6 | PA7 |

Figure 3:
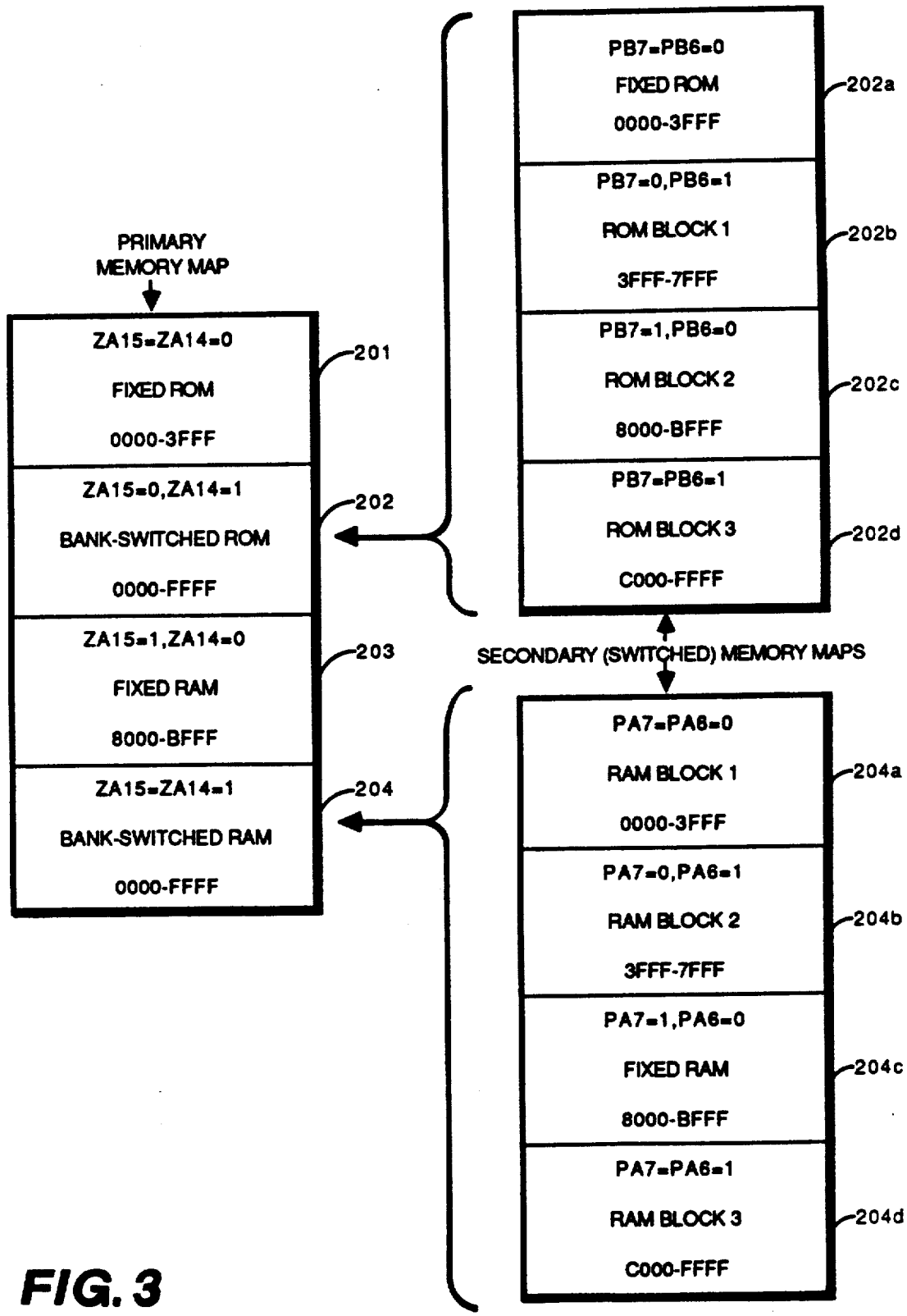
FIG. 3 is an illustration of the memory map for the preferred embodiment.

Turn now to FIG. 3 which is an illustration of the memory map for the preferred embodiment. The memory is broken into a primary memory map and secondary (switched) memory maps. The primary memory map is divided into four sections 201, 202, 203, and 204. There are 16 address lines (ZA0–ZA15) and therefore the primary memory map accesses 65,536 bytes and is divided into the four sections 201, 202, 203, and 204, each having 16,384 bytes. Sections 201 and 203 are used to directly access 16,384 bytes of ROM and RAM, respectively. Sections 202 and 204 are used to access the bank-switched ROM and bank-switched RAM, respectively. Section 202 is divided into four blocks 202A, 202B, 202C, and 202D. Block 202A is, like section 201, the first 16,384 bytes of ROM 60. ROM 60 comprises 65,536 bytes and blocks 202B, 202C, and 202D are the next three 16,384 byte blocks of ROM 60. However, when section 202 and therefore blocks 202A, 202B, 202C, and 202D are in use, PB6 conductor 45 and PB7 conductor 46 are used to select the desired 16,384 bytes of ROM 60.

RAMs 61 and 62 also comprise 65,536 bytes and are similarly divided into four blocks 204A, 204B, 204C, and 204D of 16,384 bytes each. Also, note that section 203 and block 204C are the same, 16,384 bytes of RAM. However, when section 204 and therefore blocks 204A, 204B, 204C, and 204D are in use PA6 conductor 43 and PA7 conductor 44 are used to select the appropriate 16,384 byte block of RAM. Therefore, microprocessor 10 can access and control 65,536 bytes of ROM and 65,536 bytes of RAM.

In normal operation, when reading from ROM 60, address line ZA15 is a logic 0 and address line ZA14 is either a logic 0 or a logic 1, depending upon the particular section of ROM 60 to be accessed. Likewise, in normal use, when reading from or writing to RAMs 61 and 62, address line ZA15 is a logic 1 and address line ZA14 is a logic 1 or logic 0, depending upon the particular section of RAM to be accessed.

From FIG. 3, it will be appreciated that one method of transferring data from the ROM to the RAM would be to place a logic 1 onto address line ZA14, make PA6 equal to PB6, make PA7 equal to PB7, and make address line ZA15 equal to zero. The data can then be read from the ROM into microprocessor 10. Then, address line ZA15 is made a logic 1 and the data is then written from microprocessor 10 into the RAM. Address line ZA15 is then again made a logic 0, the remaining address lines are changed to point to the next byte of data in the ROM, and the procedure is repeated. Note that address line ZA15 must be toggled between each read and write operation. However, a simpler method of transferring data from the ROM into RAM now exists.

It will be appreciated from an inspection of OR-gates 15 and 16 that address line ZA15 is decoded and used to select whether reading is to be done from the ROM or the RAM. However, note that address line ZA15 is not decoded when writing to the RAM. This is shown in Table 2. Line A of Table 2 shows the control line settings to read data from the ROM. Line B of Table 2 shows the control line settings normally used to write data into the RAM. Note that address line ZA15 has been toggled between line A and line B of Table 2, as described in the normal operation above. However, since address line ZA15 is not decoded for the write operation, line C shows it is possible to write to RAM without toggling address line ZA15. Therefore, when transferring blocks of data from the ROM to the RAM it is not necessary to toggle address line ZA15. Therefore, blocks of data can be transferred from the ROM to the RAM, at the similar address by simply conducting a read operation from the ROM, conducting a write operation to the RAM, and then updating or incrementing the address. Since, when address line ZA15 is a logic 0, the ROM is selected for the read operation and, when address line ZA15 is logic 1, the RAM is selected for the read operation, one would consider the ZA15 address line as selecting either the ROM or RAM. Further, since, as shown in Table 2, address line ZA15 may remain at a logic 0 when conducting write operations to the RAM, and since, when address line ZA15 is a logic 0, address line ZA15 "points" to the ROM then, by line C of Table 2, one can conduct block transfers of data by reading from the ROM and then "writing" the data back to the ROM. Of course, it will be understood that one cannot literally write to the ROM but, since address line ZA15 is considered to point to the ROM, one can write to the RAM by commanding processor to "write" to the ROM.

TABLE 2

| | ROM/RAM CONTROL | | | | |
|---|---|---|---|---|---|
| | CONTROLS | | | OPERATION | |
| Line | ZA15 | NMREQ | NWR | NRD | ROM | RAM |
| A | 0 | 0 | 1 | 0 | READ | NONE |
| B | 1 | 0 | 0 | 1 | NONE | WRITE |
| C | 0 | 0 | 0 | 1 | NONE | WRITE |
| D | 1 | 0 | 1 | 0 | NONE | READ |
| E | X | 1 | X | X | NONE | NONE |

X = DON'T CARE

Since the NRD signal goes both to ROM 60 and EEPROM 63, and the NWR signal goes both to RAMs 61 and 62 and to EEPROM 63, and at least some of address lines ZA0–ZA15 go to all three devices and also to the other modem circuits 11, PIO 12, and decoder 13, it is necessary to be able to disable the other modem circuits 11, PIO 12, decoder 13, and EEPROM 63 when the ROM or the RAM is being accessed. This is accomplished by using the NIORQ signal on conductor 25 to enable the selected one of the other modem circuits 11, PIO 12, and EEPROM 63, and connecting the NM1 output of microprocessor 10 to the CS1 input of decoder 13. Now, whenever NM1 conductor 22 has a logic 0 placed upon it by microprocessor 10, all of the outputs of decoder 13 become a logic 1 thereby disabling the other modem circuits 11, PIO 12 and EEPROM 63.

This use of the NM1 signal to control the outputs of decoder 13 prevents an erroneous device selection during an interrupt acknowledge cycle of microprocessor 10. During an interrupt acknowledge cycle, microprocessor 10 places a logic 0 on both the NM1 and the NIORQ conductors. If only the NIORQ signal was used, a device could be improperly selected during the interrupt acknowledge cycle. However, the NM1 signal, as connected to decoder 13, forces the outputs of decoder 13 to a logic 1 state, thereby preventing a device from being selected, even when the NIORQ signal is a logic 0.

Turning again to FIG. 1B, the output of a 7.3728 MHz oscillator 72 is connected by conductor 80 to the input of inverter 74 and to the clock input of a divide-by-2 divider 73. The output (Q) of divider 73 is a 3.6864 MHz clock. The Q output of divider 73 is connected by CLK conductor 27 to the circuits in FIG. 1A and to the clock input of flip-flop 76. NMREQ conductor 26 is connected to the data (D) input of flip-flop 76. The Q output of flip-flop 76 is connected by conductor 82 to the B/NA input of MUX 71 and the data (D) input of flip-flop 77. The negated Q output of flip-flop 76 is connected to the negated set (S) input of flip-flop 77. The output of inverter 74 on conductor 81 is the inverted 7.3728 MHz clock on conductor 80. The output of inverter 74 is connected by conductor 81 to the clock input of flip-flop 77. The Q output of flip-flop 77 is connected by conductor 83 to the NCAS inputs of of RAMs 61 and 62.

Flip-flop 76 is used to generate the multiplexer control signal (B/NA) for multiplexer 71. When flip-flop 76 places a logic 0 onto conductor 82, MUX 71 connects its A0–A7 inputs to its X0–X7 outputs. Likewise, when flip-flop 76 places a logic 1 onto conductor 82 MUX 71 connects its B0–B7 inputs to its X0–X7 outputs. Address lines ZA0–ZA13, in conjunction with the A and B outputs of MUX 70 form a 16 line address bus. However, RAMs 61 and 62 only have 8 address inputs (A0–A7) and require that the 16 bit address be provided as two serial 8 bit (row and column) addresses. When the NMREQ signal on conductor 26 is a logic 1, and after it has been clocked through flip-flop 76, MUX 71 places address lines ZA8–ZA13 and the A and B outputs of MUX 70 onto 8 bit address 78 as the first 8 bit (row) address to RAMs 61 and 62. When the NMREQ signal on conductor 26 becomes a logic 0, and after it has been clocked through flip-flop 76, MUX 71 places address lines ZA0–ZA7 onto address bus 78 as the second group of 8 bits for the column address. The first and second group of the address bits to RAMs 61 and 62 are known as the row address and column address, respectively. The row address is accepted by RAMs 61 and 62 on the high to low transition of the NRAS input (NMREQ conductor 26). The column address is accepted upon the high to low transition of the NCAS input (conductor 83). Flip-flop 76 and MUX 71, in conjunction with the NMREQ signal, cause the address to be multiplexed into RAMs 61 and 62 at the proper time and in the proper sequence. Since MUX 71 will have some delay associated with it, the Q output of flip-flop 76 cannot be directly used to create the NCAS signal. Delaying the Q output of flip-flop 76 is one of the functions of flip-flop 77. Flip-flop 77 delays the Q output of flip-flop 76 so that the NCAS signal on conductor 83 does not begin the high to low transition until the address on address bus 78 has become stable.

This is more clearly shown in FIG. 4 which illustrates the timing sequence between the clock on conductor 80, the inverted clock on conductor 81, the clock on conductor 27, the NMREQ (NRAS) signal on conductor 26, the Q output of flip-flop 76 on conductor 82, the NCAS signal on conductor 83, and the state of address lines ZA0–ZA15.

RAMs 61 and 62 have a "hidden" refresh feature. This hidden refresh is activated by placing logic 0 on the NRAS and NCAS inputs and then pulsing (logic 1) the NRAS signal. The logic 1 pulse on the NRAS input increments an internal 8 bit counter (not shown) in RAMs 61 and 62. The logic 1 pulse on the NRAS input must have a duration at least as long as the RAS precharge time for the RAM used. In the preferred embodiment, the TMM41464 RAM has a RAS precharge time of 90 nanoseconds. The Z84C00 microprocessor provides at least a 110 nanosecond logic 1 pulse on the NMREQ signal, so the RAS precharge time is adequately met. This internal 8 bit counter is used to refresh an entire row. Microprocessor 10 also provides a refresh address but the refresh address provided by microprocessor 10 is only 7 bits (ZA0–ZA6) and therefore cannot refresh the entire memory in RAMs 61 and 62. However, since the internal counter is 8 bits, it can refresh the entire memory a row at a time. It will be noted that the NMREQ signal on conductor 26, as provided by microprocessor 10, has the required logic 1 pulse. However, this logic 1 pulse must be eliminated before providing it to the NCAS input of RAMs 61 and 62 or the hidden refresh feature of RAMs 61 and 62 will not be activated. Therefore, another function of flip-flop 76 is to prevent the logic 1 pulse on NMREQ conductor 26 from being provided to the NCAS input of RAMs 61 and 62. Note that the logic 1 pulse of the NMREQ signal occurs between logic 0 to logic 1 transitions of the clock on conductor 27. Therefore, the logic 1 pulse on NMREQ conductor 76 will not be clocked through flip-flops 76 and 77 onto conductor 82 or conductor 83. Therefore, the NCAS input remains at a logic 0 while the NRAS input is pulsed (logic 1) and the hidden refresh is thereby enabled. The logic 1 pulse on the NMREQ signal from microprocessor 10 occurs during an instruction of code fetch and a non-maskable interrupt request cycle.

RAMs 61 and 62 require all 256 rows to be refreshed at least once every four milliseconds. The EX(SP),IX instruction of microprocessor 10 requires, including M cycles and T states, 29 cycles of the clock on conductor 27. The clock on conductor 27, as previously stated, has a frequency of 3.6864 megahertz or, approximately 271 nanoseconds. There are $2^8$ (256) rows to be refreshed. Therefore, 29 cycles times 270 nanoseconds per cycle times 256 rows requires, under the worst case, approximately two milliseconds to refresh the entire RAM, which is well within the four milliseconds specified by the manufacturer.

From the above description and drawings, many other embodiments of the present invention may suggest themselves to those skilled in the art. Therefore, the invention is to be limited only by the claims below.

I claim:

1. In a processor controlled system having a processor and at least one memory, said processor providing an N bit address line, said N bit address line being dividable into an A bit higher order address, and a N-A bit lower order address, K bits of said lower order address being used to selectively enable said memory, and up to N-K bits of said N bit address line being used to specify a desired data address in said memory, said memory having L address line inputs for specifying $2^L$ data addresses in said memory, said L address lines being dividable into a C bit higher order address and an L-C bit lower order address, a first data of said string of data to be stored at a first memory address, and remaining data of said string of data to be stored at consecutive memory addresses, an improved method for addressing said memory for storing said string of data, comprising:

(a) setting the value of A to equal L-C;
(b) setting the value of K to equal N-L;
(c) providing said A bit higher order address from said processor to said memory as said L-C bit lower order address;
(d) providing up to N-A-K bits of said N-A bit lower order address from said processor to said memory as said C bit higher order address, where N-A-K equals C;
(e) setting said A bit higher order address and said N-A-K bits of said N-A bit lower order address to point to said first memory address;
(f) enabling said memory using up to said K bits of said N-A bit lower order address;
(g) transferring said first data to said memory;
(h) altering said A bit higher order address;
(i) transferring a next data of said string of data to said memory; and
(j) repeating steps (h) and (i) until said string of data has been transferred to said memory.

2. The method of claim 1 wherein N equals 16 and A equals 8.

3. The method of claim 1 wherein L equals 11 and C equals 3.

4. The method of claim 3 wherein N equals 16 and A equals 8.

5. In a processor controlled system having a processor and at least one memory, said processor providing an N bit address line, said N bit address line being dividable into an A bit higher order address, and a N-A bit lower order address, K bits of said lower order address being used to selectively enable said memory, and up to N-K bits of said N bit address line being used to specify a desired data address in said memory, said memory having L address line inputs for specifying $2^L$ data addresses in said memory, said L address lines being dividable into a C bit higher order address and an L-C bit lower order address, a first data of said string of data to be stored at a first memory address, and remaining data of said string of data to be stored at consecutive memory addresses, an improved method for addressing said memory for retrieving said string of data, comprising:

(a) setting the value of A to equal L-C;
(b) setting the value of K to equal N-L;
(c) providing said A bit higher order address from said processor to said memory as said L-C bit lower order address;
(d) providing up to N-A-K bits of said N-A bit lower order address from said processor to said memory as said C bit higher order address, where N-A-K equals C;
(e) setting said A bit higher order address and said N-A-K bits of said N-A bit lower order address to point to said first memory address;
(f) enabling said memory using up to said K bits of said N-A bit lower order address;
(g) retrieving said first data from said memory;
(h) altering said A bit higher order address;
(i) retrieving a next data of said string of data from said memory; and
(j) repeating steps (h) and (i) until said string of data has been retrieved from said memory.

6. A method of claim 5 wherein N equals 16 and A equals 8.

7. The method of claim 5 wherein L equals 11 and C equals 8.

8. The method of claim 7 wherein N equals 16 and A equals 3.

* * * * *

UNITED STATES PATENT AND TRADEMARK OFFICE
CERTIFICATE OF CORRECTION

PATENT NO. : 5,007,020

DATED : April 9, 1991

INVENTOR(S) : Jeffrey Inskeep

It is certified that error appears in the above-identified patent and that said Letters Patent is hereby corrected as shown below:

Title page: Item (54) should read --Method for memory addressing and control with reversal of higher and lower addresses--.

Column 14, line 54, "8" should read --3--.

Signed and Sealed this

Thirteenth Day of April, 1993

Attest:

STEPHEN G. KUNIN

*Attesting Officer*      *Acting Commissioner of Patents and Trademarks*